United States Patent

Shoki

[11] Patent Number: 5,958,627
[45] Date of Patent: *Sep. 28, 1999

[54] X-RAY MASK BLANK AND METHOD OF MANUFACTURING THE SAME

[75] Inventor: Tsutomu Shoki, Tokyo, Japan

[73] Assignee: Hoya Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/822,978

[22] Filed: Mar. 21, 1997

[30] Foreign Application Priority Data

Sep. 3, 1996 [JP] Japan .................................. 8-233402

[51] Int. Cl.$^6$ ........................................................ G03F 9/00
[52] U.S. Cl. ........................ 430/5; 430/396; 204/192.28; 428/336; 428/450
[58] Field of Search .................. 430/5, 396; 204/192.28; 428/336, 450

[56] References Cited

U.S. PATENT DOCUMENTS

| | | | |
|---|---|---|---|
| 5,005,075 | 4/1991 | Kobayashi et al. | 375/35 |
| 5,291,536 | 3/1994 | Itoh et al. | 378/35 |
| 5,496,667 | 3/1996 | Yabe et al. | 430/5 |
| 5,541,023 | 7/1996 | Kondo et al. | 430/5 |
| 5,754,619 | 5/1998 | Yoshihara et al. | 378/35 |

FOREIGN PATENT DOCUMENTS

| | | | |
|---|---|---|---|
| 1-150324 | 6/1989 | Japan | H01L 21/30 |
| 2-192116 | 7/1990 | Japan | H01L 21/027 |
| 3-204919 | 9/1991 | Japan | H01L 21/027 |
| 5-326380 | 12/1993 | Japan | 204/192.28 |

*Primary Examiner*—Nam Nguyen
*Assistant Examiner*—Steven H. VerSteeg
*Attorney, Agent, or Firm*—Sughrue, Mion, Zinn, Macpeak & Seas, PLLC

[57] ABSTRACT

An X-ray mask blank (25) comprises a substrate (23), an X-ray transparent film (29), and an X-ray absorber film (27). The X-ray absorber film has a surface roughness within a range not more than 2.0 mmRa. Ra represents a center line average height. The X-ray absorber film exhibits a stress between 0 and ±10 MPa at a plurality of points on a predetermined area. Preferably, the X-ray mask blank is specified by a product of a stress and a thickness, both of which are measured at the same points. The product falls within a range between 0 and $\pm 5 \times 10^3$ dyn/cm.

24 Claims, 10 Drawing Sheets

STRESS (dyn/cm²)

| | | | |
|---|---|---|---|
| 59mm⌀ | AVERAGE | -4.077E+07 | |
| | MAXIMUM | 6.427E+07 | (257.7%) |
| | MINIMUM | -2.191E+08 | (437.5%) |
| 30mm SQUARE | AVERAGE | -1.282E+08 | |
| | MAXIMUM | 2.596E+07 | (112.4%) |
| | MINIMUM | -2.191E+08 | (70.9%) |
| 25mm SQUARE | AVERAGE | -1.618E+08 | |
| | MAXIMUM | -6.930E+07 | (57.2%) |
| | MINIMUM | -2.191E+08 | (35.4%) |

STRESS (dyn/cm²)

| | | |
|---|---|---|
| 59mmø AVERAGE | 2.447E+07 | |
| MAXIMUM | 5.173E+08 | (%2013.8%) |
| MINIMUM | -8.832E+08 | (%3709.0%) |
| 30mm SQUARE AVERAGE | -3.967E+08 | |
| MAXIMUM | 3.695E+08 | (193.1%) |
| MINIMUM | -8.832E+08 | (122.6%) |
| 25mm SQUARE AVERAGE | -5.790E+08 | |
| MAXIMUM | -7.449E+07 | (87.1%) |
| MINIMUM | -8.832E+08 | (52.5%) |

| | |
|---|---|
| A' | 5.173E+08 |
| B' | 3.530E+08 |
| C' | 1.887E+08 |
| D' | 2.447E+07 |
| E' | -2.025E+08 |
| F' | -4.294E+08 |
| G' | -6.563E+08 |
| | -8.832E+08 |

X-RAY MASK BLANK AND METHOD OF MANUFACTURING THE SAME

BACKGROUND OF THE INVENTION

The present invention relates to an X-ray mask blank used for X-ray lithography and a method of manufacturing the X-ray mask blank.

In the semiconductor industries, a photolithography process is used for forming a minute pattern of integrated circuit on a silicon wafer or the like. In this event, the minute pattern is transcribed on the silicon wafer or the like by the use of a visible light and/or an ultraviolet ray as an exposing electromagnetic wave.

In accordance with a progress of a large integration technique in semiconductor devices, such as an ultra large scale integrated circuit, a high integration technique is required to transcribe more minute pattern to the silicon wafer or the like than that made by the use of the visible light and/or ultraviolet light.

In reply to a demand of a technique of transcribing a more minute pattern by the use of the visible light and/or the ultraviolet ray, an X-ray lithography process is progressed.

The X-ray lithography process uses an X-ray of a wavelength shorter than that of the visible light and/or the ultraviolet ray and is tried for transcribing such a very minute pattern to the silicon wafer or the like.

In the X-ray lithography process, use is made of an X-ray mask comprising the very minute pattern of an X-ray absorber material supported by a silicon substrate through an X-ray transparent film on the silicon substrate. The X-ray transparent film is generally made of a silicon carbide while the X-ray absorber material is formed by an amorphous material containing tantalum (Ta). With this X-ray mask, exposure is carried out through the X-ray mask onto the silicon wafer or the like to transcribe the the very minute pattern of the X-ray absorber material to the silicon wafer or the like. Such a film of the X-ray absorber material will be called an X-ray absorber film.

Such an X-ray mask is obtained by patterning an X-ray mask blank which comprises the X-ray absorber film of tantalum (Ta), tungsten (W), or a compound containing metals thereof.

On manufacturing the X-ray mask blank, the X-ray absorber film is deposited on the X-ray transparent film by sputtering. Such an X-ray mask blank has been proposed in Japanese Unexamined Patent Publication No. Hei 2-192116, namely, 192116/1990 and has an X-ray absorber film of Ta and B.

In the mean while, a high accuracy of position has been required. Such a high accuracy is accomplished by reducing a positional distortion on the X-ray mask. A high internal stress of the X-ray absorber film induces the positional distortion. The positional distortion is strongly influenced by an internal stress of a mask material.

In this event, the X-ray absorber film is required to have a small internal stress in order to minimize the positional distortion. For example, a distortion should fall within 22 $\mu$m for the mask used for a one giga bits dynamic random access memory (1G-DRAM) formed by a design rule of 0.18 $\mu$m.

As a technique to minimize the internal stress of the X-ray absorber film, a method is disclosed in JPA-150324/1989. The method of JPA-150324/1989 comprises steps of forming an X-ray absorber material of Ta having a tensile stress of about $1 \times 10^9$ dyn/cm$^2$ (100 MPa) on an X-ray transparent film formed on a substrate by the use of a sputtering apparatus and, thereafter, heating the X-ray absorber material for a predetermined time period to form an X-ray mask capable of lowering to about $1 \times 10^8$ dyn/cm (10 MPa).

Discussion has been often made to measure the internal stress accurately. In a conventional measurement method of the internal stress, only a mean stress is calculated as the internal stress in a central position, specifically, in which a radius of curvature of the substrate is measured before and after forming the film. Therefore, the mean stress is measured as the internal stress only in the central position of the silicon substrate.

Accordingly, JPA-150324/1989 never considers a uniformity of stress over the whole of the pattern area of the X-ray mask. In the X-ray mask proposed in JPA-150324/1989, Ta film structure practically has a tensile stress of about 100 MPa after formed and, apparently, has a prismatic crystal structure.

When the X-ray absorber film has a prismatic crystal structure, it has been found out according to the inventor's observation that an edge shape of pattern becomes rough and worse in forming the minute pattern. In order to finely delineate the X-ray absorber film with a minute pattern not more than 0.18 $\mu$m, it has been also found out that the X-ray absorber film should be in a fine crystalline state or amorphous structure.

Therefore, the Ta film of JPA-150324/1989 can not be applied to form a pattern of IG-DRAM.

In order to form the Ta film of a fine crystal structure, a film stress after forming should be put in a compressive state. When the Ta film is put into the compressive stress, the film is not kept in a low stress during annealing.

The followings are confirmed by a verification experiment of the present inventor. A nonuniform stress distribution causes a pattern distortion to occur on the X-ray mask even if the mean stress of the X-ray absorber film falls within a range not more than 10 MPa. Therefore, a required accuracy of position is not achieved on the X-ray absorber film because of a nonuniform stress of the pattern area.

Preferably, the X-ray absorber has a required accuracy of position over a wide pattern area of at least 25 mm square.

In the meanwhile, it is recent tend that the stress can be accurately measured by a measuring apparatus.

For example, a stress measurement system developed by NTT-AT Inc. can accurately measure a stress distribution by measuring a radius of curvature in a substrate.

The other method in which the stress distribution can be accurately measured is called Bulge method. In the Bulge method, a differential pressure is imposed on the membrane to an amount of deformation. By both of the method above-mentioned, the stress distribution can be measured more accurately inside the substrate.

When various absorber films are evaluated by stress distributions, each of the absorber films formed by methods disclosed in JP-A-192116/1990 and JP-A-150324/1989, has a nonuniform stress distribution and, therefore, can not satisfy a required accuracy of position.

Therefore, it is understood that the nonuniform distribution of the film thickness brings about the positional distortion in a nonuniformity of the stress.

SUMMARY OF THE INVENTION

It is an object of the present invention to provide an X-ray mask blank which is capable of controlling precisely an internal stress distribution and a film thickness distribution.

It is another object of the present invention to provide an X-ray mask which is obtained by the X-ray mask blank above-mentioned.

It is still another object of the present invention to provide a method of manufacturing the X-ray mask blank.

It is yet another object of the present invention to provide a method of transcribing a pattern by the use of the X-ray mask.

The inventor has carried out a simulation analysis in order to secure a required accuracy of position. As a result, it is found out that an absorber film of 0.5 μm thick exhibits a stress not more than 10 MPa. Furthermore, it has been confirmed that the positional distortion of the X-ray mask adversely effects a film thickness distribution of absorber film and depends on a product of a film stress and a film thickness.

From the above viewpoints, the present invention is made as follows.

According to one aspect of the present invention, there is provided an X-ray mask blank which comprises a substrate, an X-ray transparent film on the substrate, and an X-ray absorber film which is formed on the X-ray transparent film. The X-ray absorber film has a surface roughness within a range not more than 2.0 nmRa (wherein Ra represents a center line average height) and a predetermined area, and exhibits a stress between 0 and ±10 MPa in a plurality points in the predetermined area.

According to another aspect of the present invention, there is provided an X-ray mask blank which comprises a substrate, an X-ray transparent film on the substrate, and an X-ray absorber film which is formed on the X-ray transparent film. The X-ray absorber film has a predetermined area, and exhibits a stress between 0 and ±10 MPa at a plurality of points on the predetermined area. In the X-ray mask blank, the X-ray absorber film has a thickness between 0.1 and 1.0 μm, and is specified by a product of the stress and the thickness both of which are measured at the same points. The product falls within a range between 0 and $\pm 5 \times 10^3$ dyn/cm.

According to still another aspect of the present invention, there is provided an X-ray mask manufactured by patterning the X-ray mask blank above-mentioned According to yet another aspect of the present invention, there is provided a method producing an X-ray mask blank which comprises steps of preparing a predetermined substrate, forming an X-ray transparent film on the substrate, and forming an X-ray absorber film on the X-ray transparent film by sputtering process using Xe gas as a sputtering gas.

According to a further aspect of the present invention, there is provided a method of transcribing a pattern to a substrate using the X-ray mask above-mentioned.

DESCRIPTION OF THE PREFERRED EMBODIMENT

For a better understanding of the present invention, description will be made as regards a conventional X-ray mask and a conventional X-ray mask blank with reference to FIGS. 1 and 2.

Figure 1:
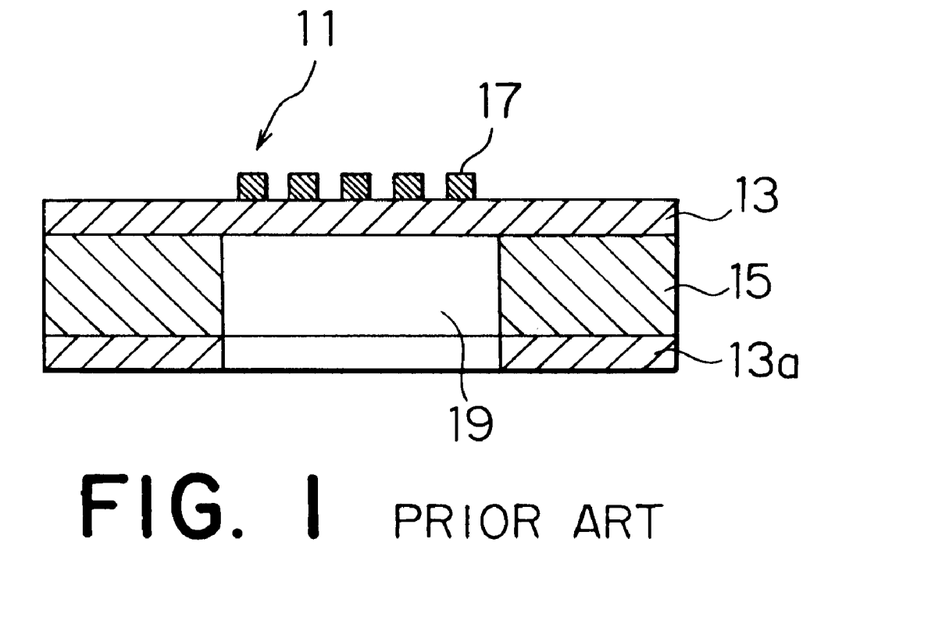
FIG. 1 is a cross-sectional view for use in explaining a structure of a conventional X-ray mask.

Referring to FIG. 1, a conventional X-ray mask 11 has an X-ray transparent membrane or film 13 formed on a surface of a silicon substrate portion 15 and an X-ray absorber pattern 17 formed on the X-ray transparent film 13. The silicon substrate portion 15 has an X-ray transparent film portion 13a on another surface. Therefore, the pattern 17 is attached to the X-ray transparent film 13 supported by the silicon substrate portion 15. The silicon substrate portion 15 has a window area 19 formed on the back side of the X-ray transparent film 13' corresponding to a position of the pattern 17.

Figure 2:
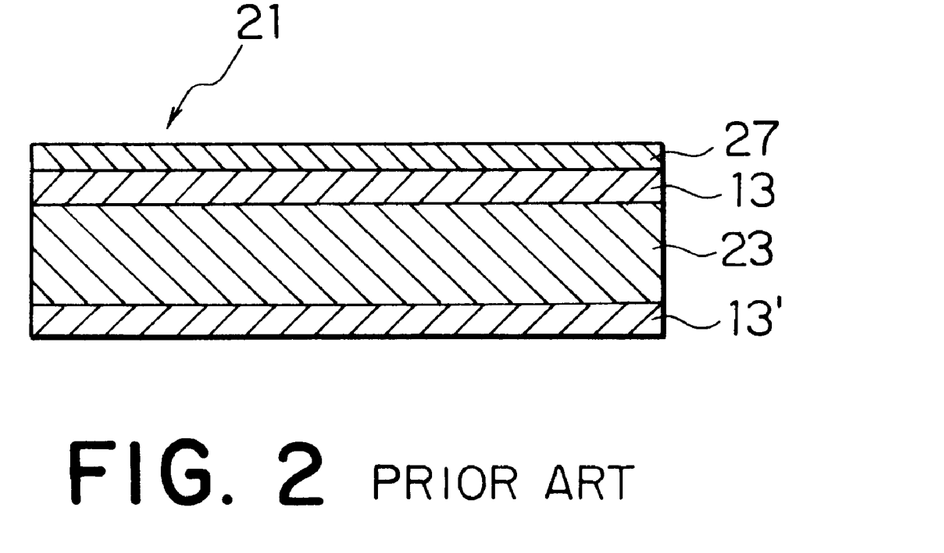
FIG. 2 is a cross-sectional view for use in explaining a structure of a conventional X-ray mask blank.

Referring to FIG. 2, a conventional X-ray mask blank 21 comprises a silicon substrate 23, the X-ray transparent films 13 and 13' formed on both of the surfaces of the silicon substrate 23, and an X-ray absorber film 27 formed on the X-ray transparent film 13.

As a material for the X-ray transparent films 13 and 13', use is generally made of silicon carbide having a high Young's modulus and resistance against an irradiation of X-ray. As a material for the X-ray absorber film 27, use is often made of an amorphous material containing Ta element which has high resistance against the irradiation of X-ray.

The X-ray mask 11 is manufactured from the X-ray mask blank 21. This formation process for the X-ray mask 11 is as follows. First, the X-ray mask blank 21 is placed on one surface by a resist film. The resist film is delineated into a desired pattern. The X-ray mask blank 21 is dry-etched through the desired pattern to form an X-ray absorber pattern 17. Thereafter, the X-ray transparent film 13' is partly removed on the back side to the silicon substrate 23 by a reactive ion etching process (RIE) using a tetrafluoromethane gas ($CF_4$). Thus, the window area 19 is formed in the center portion of the X-ray mask blank 21.

Next, the silicon substrate 23 is etched by an etchant of a mixture of hydrofluoric acid and nitric acid to form the X-ray mask 11. Herein, an electron beam (EB) resist is used as a resist film of the X-ray mask 11. Thereby, a pattern is made by an electron beam delineation process.

Now, description will be schematically made as regards an X-ray mask blank according to the present invention.

The X-ray mask according to the present invention is similar in structure to that illustrated in FIG. 2 except that the X-ray transparent film 13 are mirror-polished, as will be described in detail in connection with FIGS. 3A to 3C. In order to distinguish between the X-ray transparent film 13 of the conventional X-ray mask blank and those of the present invention, the latter will be called polished X-ray transparent film 29 hereinunder. The X-ray transparent film 13' has a similar structure to that of the conventional X-ray mask blank.

The polished X-ray transparent films are made of SiC, SiN, diamond, or the like.

Recently, a high accuracy of position is required for an X-ray mask which is formed from the X-ray mask blank, as mentioned before. It should be recollected here that a pattern distortion has to be controlled within a range not more than 22 nm in the X-ray mask which is used for 1G-DRAM and which has a design rule pattern of 0.18 µm. This means that the X-ray absorber film must be deposited on the polished X-ray transparent film 13 with the high accuracy.

Herein, consideration will be made about the X-ray absorber film 27. It has been pointed out that a positional distortion of pattern is influenced by a film stress of the X-ray absorber film 27. Such a film stress will be after called an internal stress so as to specify the nature of the X-ray absorber film 27. For controlling the positional distortion of pattern, it is important to suppress a nonuniform film stress, i.e., to make a stress distribution low.

The film stress is influenced by a film thickness of the X-ray absorber film 27. In the present invention, the X-ray absorber film 27 has a thickness between 0.3 µm and 0.8 µm because of improvement of a property of pattern transcription. Furthermore, the X-ray absorber film 27 has a film thickness distribution between 0 to 50 nm. Moreover, the X-ray absorber film 27 exhibits a film stress within a range between 0 to ±10 MPa in a plurality of points in a predetermined area on which the X-ray mask pattern will be formed. The predetermined area is called an X-ray mask pattern area.

In the present invention, the reason why the stress is limited within a range between 0 to ±10 MPa will be mentioned hereinunder. When the stress of the X-ray absorber film falls out of the range between 0 to ±10 MPa, a stress distribution becomes nonuniform and is liable to cause a pattern positional distortion to occur on X-ray absorber film 27. As a result, the X-ray mask can hardly exhibit a high accuracy of position.

Furthermore, a product of a film stress and a film thickness is considered in connection with the the X-ray mask blank and falls within a range between 0 to ±5×10³ dyn/cm at a plurality of points on the X-ray mask pattern area of the X-ray absorber film.

In the present invention, the above-mentioned product is thus limited within the range between 0 to ±5×10³ dyn/cm. The reason will also be described hereinunder. When the product of the film stress and the film thickness does not fall within the range between 0 to ±5×10³ dyn/cm, the stress distribution becomes nonuniform and, as a result, a pattern positional distortion. Therefore, the X-ray mask can not exhibit a high accuracy of position. In a similar viewpoint, the product of the film stress and the film thickness is preferably selected within a range between 0 to ±4×10³ dyn/cm and, more preferably, within a range between 0 to ±3×10³ dyn/cm.

In the present invention, the X-ray mask blank may include between the polished X-ray transparent film 29 and the X-ray absorber film 27 a film, such as an etch-stopping layer, an adhesion layer, an antireflection layer, and a conductive layer. The X-ray mask blank may also include a mask layer, a protective layer, or a conductive layer, each of which is formed on the X-ray absorber film. In the X-ray mask blank, the X-ray absorber film of an amorphous structure may be formed by a material containing Ta as a main element, or a material containing Ta and B.

A low stress is accomplished on the X-ray absorber film 27 when the X-ray absorber film is formed by an amorphous material.

In the X-ray absorber film 27, the amorphous structure serves to reduce a stress distribution, as mentioned above, and to give an excellent pattern with a fine workability. When the X-ray absorber film of only Ta element is used, it is difficult to deposit the X-ray absorber film of the amorphous structure because the stress distribution must be controlled in a manner which is used for forming in a fine crystal state.

Under the circumstance, such an X-ray absorber film of amorphous structure may be made of a material containing Ta and nitrogen, oxygen, boron, or carbon. When use is particularly made of a material containing Ta and B, the film stress of the deposited film can be easily minimized by a controlling a sputtering condition, such as a gas pressure. Furthermore, the deposited film has a high purity and a large X-ray absorbance. In order to obtain the amorphous structure film, an atomic ratio of Ta to B is preferably selected between 15 to 25 at %.

In the meanwhile, a stress distribution of the X-ray absorber film depends on a roughness of a surface on which the X-ray absorber film is deposited. The rough surface has a stress distribution lower than that of a smooth one.

However, a roughness of a surface, for example, a surface of the polished X-ray transparent film 29, on which the X-ray-absorber film 27 is formed, would be preferably formed to be smooth from the viewpoint of decreasing an edge roughness of a minute pattern.

Accordingly, the X-ray mask which is excellent in both pattern distortion and reduction of the edge roughness c an be obtained by means of making smooth a surface on which the X-ray absorber film 27 is formed, and, furthermore, by means of controlling a stress distribution and a film thickness as to the X-ray transparent film.

Then, the surface, on which the X-ray absorber film is deposited, has a roughness within a range not more than 2.0 nmRa, preferably, within a range not more than 15 nmRa, more preferably, within a range not more than 1.2 nmRa. Thereby, it is possible to form the X-ray absorber film having a smooth surface not more than 2 nmRa.

In order to obtain the smooth surface, the surface of the X-ray transparent film 29 is subjected to a mirror polishing process or an etch-back process.

The X-ray mask blank has the X-ray absorption film which is formed on a surface with a surface roughness within a range not more than 2.0 nmRa.

The first through the third processes have been attempted to deposit the X-ray absorber film 27 which is capable of controlling the film stress or the product of the film stress and the film thickness in the X-ray mask pattern area.

In the first process, the X-ray transparent film 29 is annealed after being formed so as to have a predetermined film thickness distribution.

In the second process, sputtering in a Xe gas atmosphere is carried out to form the X-ray absorber film 27 which has a predetermined film thickness distribution. In this case, a target is used which consists of an X-ray absorber film material.

In the third process, the X-ray absorber film is formed on a rough surface between 2 and 20 nmRa and has a predetermined film thickness distribution.

In the first process, annealing is preferably carried out at a temperature between 200 and 350° C. Moreover the sputtering in the second process may be rf magnetron sputtering or dc magnetron sputtering.

Furthermore in the first and the second processes, a desired low distortion distribution can be obtained even if the X-ray absorber film 27 has a relative smooth surface such that a surface roughness is fallen within a range not more than 2 nmRa.

On the other hand, the third process is not preferable in case where the X-ray absorber film 27 is formed on a flat surface as above-mentioned.

Taking the above into consideration, the method of manufacturing an X-ray mask blank according to the present invention may comprise a step of annealing the X-ray absorber film 27 after deposition, or a step of depositing the X-ray absorber film 27 by sputtering by the use of the Xe gas as a sputtering gas.

The X-ray mask is manufactured by patterning the X-ray mask blank above-mentioned. In the X-ray absorber film 27, a film thickness distribution is controlled by a rotation of the substrate or a revolution of the substrate and by shielding a plasma region which might cause the film nonuniformity to occur.

In the present invention, the method further comprises a step of transcribing a pattern to a substrate by use of the X-ray mask in X-ray lithography process as mentioned in connection with FIG. 1.

EXAMPLE 1

Figure 3A:
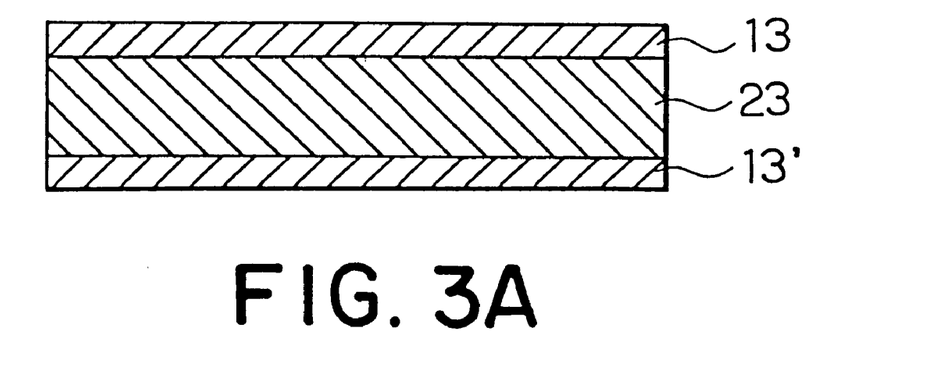
FIGS. 3A, 3B, and 3C are cross-sectional views for use in explaining a process of producing an X-ray mask blank according to the present invention.

Referring to FIG. 3A, a silicon substrate 23 is formed by X-ray transparent films 13 and 13' both on the surface into an X-ray mask membrane.

As the silicon substrate 23, use was made of a silicon substrate or wafer having a crystal direction of (100), a diameter of 3 inches, and a thickness of 2 mm.

As the X-ray transparent film 13, a silicon carbide film was formed to a thickness of 2 $\mu$m by a chemical vapor deposition (CVD) process by the use of dichlorosilane ($SiH_2Cl_2$) and acetylene ($C_2H_2$) as a reactant gas. Furthermore, the silicon carbide film was mechanically polished to obtain the polished X-ray transparent films 29 having a flat surface which surface roughness fell within a range not more than 1 nmRa. The X-ray transparent film 13' was not mechanically polished, however it is designated by a different reference number of 29'.

Figure 3B:
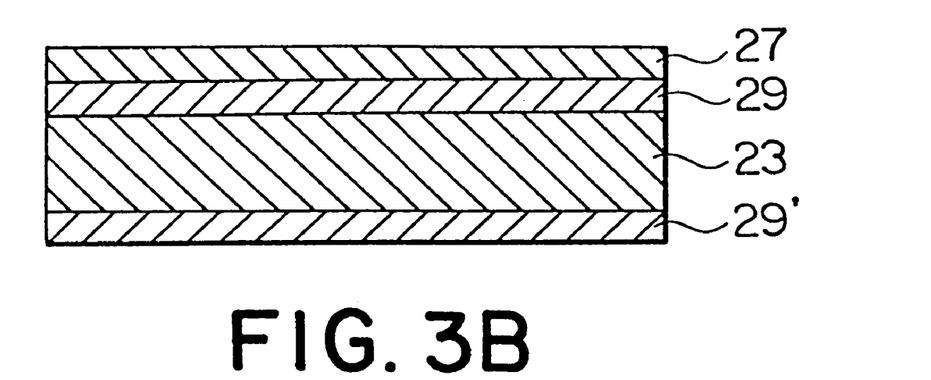

Referring to FIG. 3B, a Ta-B film was formed as the X-ray absorber film 27, on one of the flat surface of the polished X-ray transparent film 29 by an rf magnetron sputtering process by the use of Ar gas as a sputtering gas, and by the use of a target consisting of a compound with the atomic ratio (Ta/B) of 8/2. The Ta-B film had a thickness of 0.5 $\mu$m±0.03 $\mu$m on 25 mm square area and a film stress of −100 MPa±10 MPa (compressive stress) on the same area.

In a sputtering apparatus used in the above-mentioned process, the sputtering target had a diameter of 6 inches. In the process, the silicon substrate was rotated and revolved. A shielding plate was placed in a plasma in order to make a uniformity of thickness. The film was obtained under a condition of an rf power density of 6.5 W/cm$^2$ and a sputtering gas pressure of 1.0 Pa. Thereafter, the film was annealed to change the film stress to a tensile direction so that the film was controllable within a low stress range.

Table 1 shows a relationship between an annealing temperature and the film stress.

As shown in Table 1, annealing at 200° C. makes to obtain a low stress film of 0±7 MPa. A product of the film stress and the film thickness fell within a range of 0 to ±3.7×10$^3$ dyn/cm as to the film.

A stress distribution was decided by a measurement of a radius of curvature at optional 256 points on a surface of the silicon substrate before and after forming the film by the use of a high accuracy stress measurement system made in NTT-AT Inc.

A film thickness distribution was measured by the use of Tally step meter.

Figure 3C:
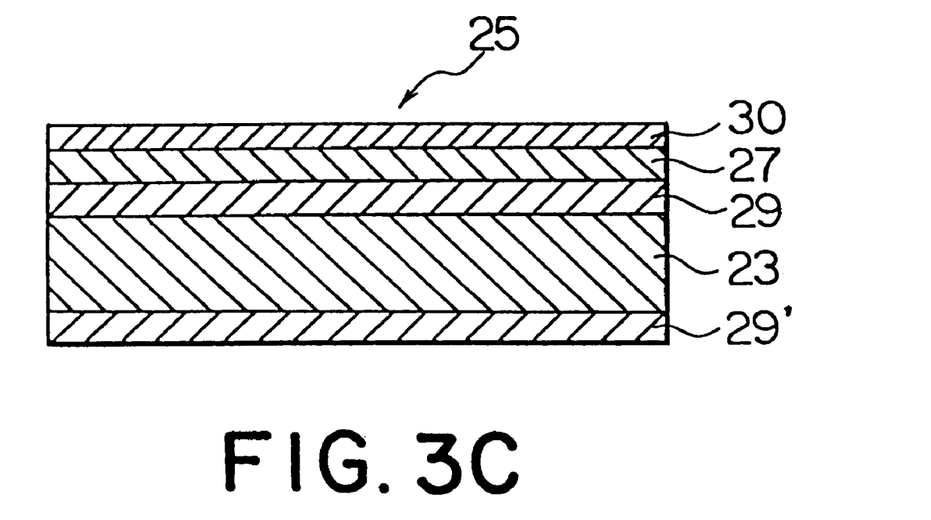

Referring to FIG. 3C, an etching mask layer 30 of a chromium film of 0.05 $\mu$m thick containing chromium carbide was deposited on the X-ray absorber film 27 by an rf magnetron sputtering process. In the process, use was made of chromium as a sputtering target and a mixture of Ar gas and 7% methane ($CH_4$) as a sputtering gas.

The etching mask layer 30 exhibited a low stress not more than 100 MPa and was obtained under condition of an rf power density of 65 W/cm$^2$ and a sputtering gas pressure of 1.2 Pa. An X-ray mask was formed by the use of the X-ray mask blank made in Example 1 in a similar manner being described in connection with FIGS. 1 and 2. The obtained X-ray mask was subjected to an evaluation of positional distortions by a coordinate measurement system. As a result, it is confirmed that a desired accuracy of position fell within a range not more than 18 nm. On the other hand, the X-ray mask was formed by the use of the X-ray absorber film exhibiting the product of the film thickness and the film stress out of the range between 0 to ±5×10$^3$ dyn/cm, which are shown as comparative samples Nos. 1 and 2. Then, the positional distortions were evaluated as for the obtained X-ray mask in a similar manner being described. As a result, it is confirmed that comparative samples does not satisfy a required accuracy of position as shown in Table 1.

EXAMPLE 2

Referring to FIG. 3A, an X-ray transparent film 13 of a silicon carbide was formed both on the surfaces of the silicon substrate 23 and, therefore, an X-ray mask membrane was made. The silicon substrate 23 had a diameter of 3 inches, a thickness of 2 mm, and a crystal direction of (100). As the X-ray transparent film 13, a silicon carbide film was deposited to a thickness of 2 $\mu$m by CVD process by the use of dichlorosilane ($SiH_2Cl_2$) and acetylene ($C_2H_2$).

The obtained silicon carbide film was mechanically polished of a surface to be flat to form a polished X-ray transparent film 29 having a smooth surface which surface roughness fell within a range not more than 1 nmRa.

Referring to FIG. 3B, an X-ray absorber film 27 of Ta-B was deposited by an rf magnetron sputtering process by the use of Xe gas substituted for Ar gas as a sputtering gas and, furthermore, by the use of a compound containing Ta and B at an atomic ratio (Ta/B) of 8/2 as a sputtering target under condition where an rf power density is 6.5 W/cm$^2$ and a gas pressure was 0.35 Pa. The Ta-B film had a film thickness of 0.5 $\mu$m±0.02 $\mu$m on a 25 mm square area and a film stress of −140 MPa±7 MPa (compressive stress) on the same area. The film was annealed to obtain a low stress of 0±4 MPa. The film exhibited a product of the film stress and the film thickness within a range of 0.5±2.05×10$^3$ dyn/cm in the 25-mm square area as shown in Table 1 as sample No. 2. Forming the Ta-B film by a Xe gas sputtering makes uniform the film thickness and a stress distribution in accordance with a uniformity of plasma density in comparison with an Ar gas sputtering.

In a similar manner being described, the film exhibited a film stress of 4±4 MPa when annealing at 260° C. after forming the film as shown in Table 1. The film exhibited the product within a range between 0 to ±4.2×10³ dyn/cm on the 25 mm square area as shown in Table 1 as sample No. 3.

Referring to FIG. 3C, an etching mask layer 30 was made of a chromium (Cr) film containing chromium carbide. The chromium film was formed into a thickness of 0.05 μm on the X-ray absorber film 27 by an rf magnetron sputtering process. The sputtering was carried out by the use of chromium as a sputtering target in a mixture of Ar gas and 7% methane ($CH_4$) having a pressure of 1.2 Pa as a sputtering gas at an rf power density of 6.5 W/cm².

TABLE 1

| | Annealing Temperature (° C.) | Film Thickness (μm) | Film Stress (×10⁷ dyn/cm) | Product of Stress and Thickness (dyn/cm) | Accuracy of Position 3σ (nm) |
|---|---|---|---|---|---|
| Comparative Sample | | | | | |
| 1 | 170 | 0.5 ± 0.03 | −8 ± 9 | <±9.0 × 10³ | 35 |
| 2 | 225 | 0.5 ± 0.03 | 15 ± 7 | <±1.2 × 10² | 45 |
| Sample | | | | | |
| 1 | 200 | 0.5 ± 0.03 | 0 ± 7 | <±3.7 × 10³ | 18 |
| 2 | 250 | 0.5 ± 0.02 | 0 ± 4 | <±2.1 × 10³ | 15 |
| 3 | 260 | 0.5 ± 0.02 | 4 ± 4 | <±4.2 × 10³ | 20 |

X-ray masks 25 were formed by the use of X-ray mask blanks as formed in Examples 1 and 2. The obtained X-ray masks were evaluated by a positional distortion coordinate measurement system.

As shown in Table 1, it is confirmed that the X-ray masks were satisfied with a predetermined accuracy of position.

In Examples 1 and 2, use was made of an rf magnetron sputtering as a sputtering process. However, the present invention is not limited to the rf magnetron sputtering. For example, dc sputtering gives a similar effect to rf magnetron sputtering.

As a sputtering gas, use was made of the mixture of Ar gas and methane. However, the present invention is not limited to this mixture. For example, use can be made of inert gas, such as Xe, Kr, and He in place of Ar. Furthermore, use can be made of a hydrocarbon gas, such as ethane ($C_2H_6$) and propane ($C_3H_8$), each of which gives a similar effect to methane.

As the X-ray absorber film 27 in place of a compound between Ta and B (Ta:B=8:2), use can be made of Ta element, amorphous material containing Ta element, or tantalum boride other than $Ta_4B$.

In addition, a structure of the X-ray mask blank is not limited to one shown in FIG. 3. Use may be made of a membrane substrate formed by etching and removing a central portion of silicon substrate after forming the X-ray transparent film 13.

As above-mentioned, the X-ray mask can be obtained which has an extremely small positional distortion occurred by the stress and which has a high accuracy of position because the product of the film stress and the film thickness is fallen within a range between 0 to ±5×10³ dyn/cm in a pattern formation region, i.e. the X-ray mask pattern area.

EXAMPLE 3

Figure 4:
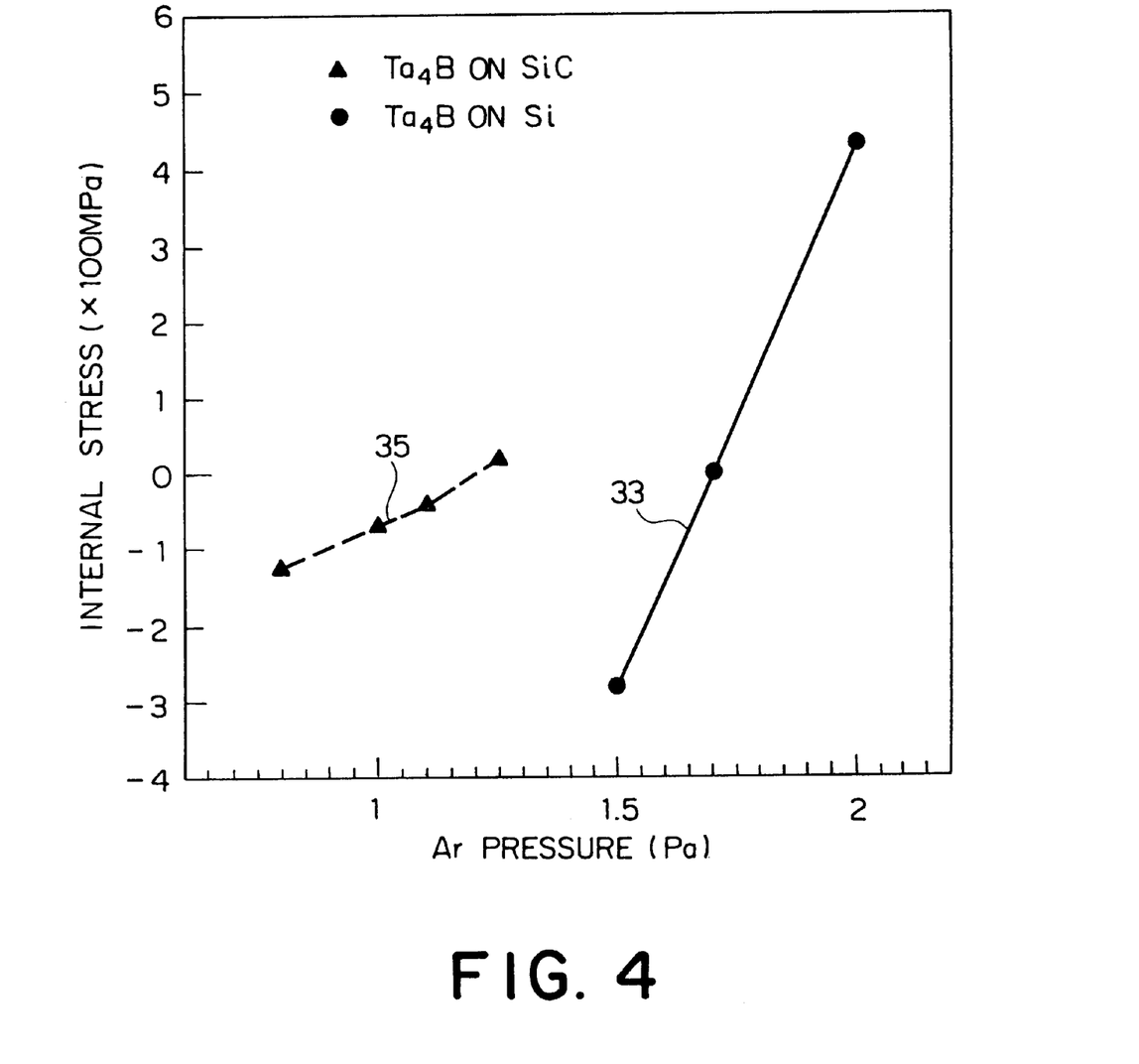
FIG. 4 is a graph illustrating a relationship between internal stresses of X-ray films formed on a rough surface of SiC or a smooth surface of Si and a pressure of sputtering gas (Ar)

Referring to FIG. 4, variations of internal stresses, namely, the film stresses of X-ray absorber films are shown as a function of a sputtering gas pressure of Ar. In FIG. 4, black circles represent variations of the X-ray absorber films of $Ta_4B$ formed on a rough surface of SiC with about 8 nmRa as illustrated in a solid line 33. On the other hand, black triangles represent variations of the X-ray absorber films of $Ta_4B$ formed on a smooth surface of Si within a range not more than 1 nmRa as illustrated in a dashed line 35.

As shown in FIG. 1, it is confirmed that the absorber film of $Ta_4B$ can exhibit a smaller internal stress on the rough surface of SiC than that on the smooth surface of Si. Furthermore, the X-ray absorber film of $Ta_4B$ can make rates of change of the stress and the gas pressure on the rough surface of SiC one order smaller than these on the smooth surface of Si and can obtain a small stress excellent in reproductivity.

On the other hand, it is disclosed in JP-A-204919/1991 that a surface of the X-ray transparent film is preferablly flattened in order to obtain an accuracy pattern of the X-ray absorber film.

Accordingly, a smooth surface of the X-ray transparent film is required to be compatible with a low film stress of the X-ray absorber film.

EXAMPLE 4

Films of $Ta_4B$ as X-ray absorber films were deposited on polished SiC films or Si wafers at ambient temperature by an rf magnetron sputtering process by the use of Ar or Xe as a sputtering gas. An rf power density was kept at 6.58 W/cm² during the deposition. The polished film of SiC had a roughness of less than 1.0 nmRa. Annealing was carried out in an air atmosphere for 1 hour to obtain almost stress free films by the use of the as-depositedly low compressive stress film. Internal stresses of the $Ta_4B$ film were calculated from the change of substrate curvature after the deposition and/or annealing. Stress distribution of the $Ta_4B$ film was measured by an "NTT-AT" stress measurement apparatus and a HOYA bulge height measurement system. The $Ta_4B$ film was etched by electron cyclotron resonance (ECR) etching system with microwave of 2.45 GHz by the use of $Cl_2$ as an etching gas. Films of Cr and $SiO_2$ deposited by an rf magnetron sputtering were prepared as etch-stopping material for the $Ta_4B$ film. Dry etching characteristics of these mask materials were evaluated by the same etching system by the use of $Cl_2$ or $Cl_2$ and $O_2$ mixture gas. Rf power of 0.12 W/cm² was applied to the substrate stage to enhance ion bombardment during the etching. The temperature of the substrate stage holder was controlled at 2.5° C.

Figure 5:
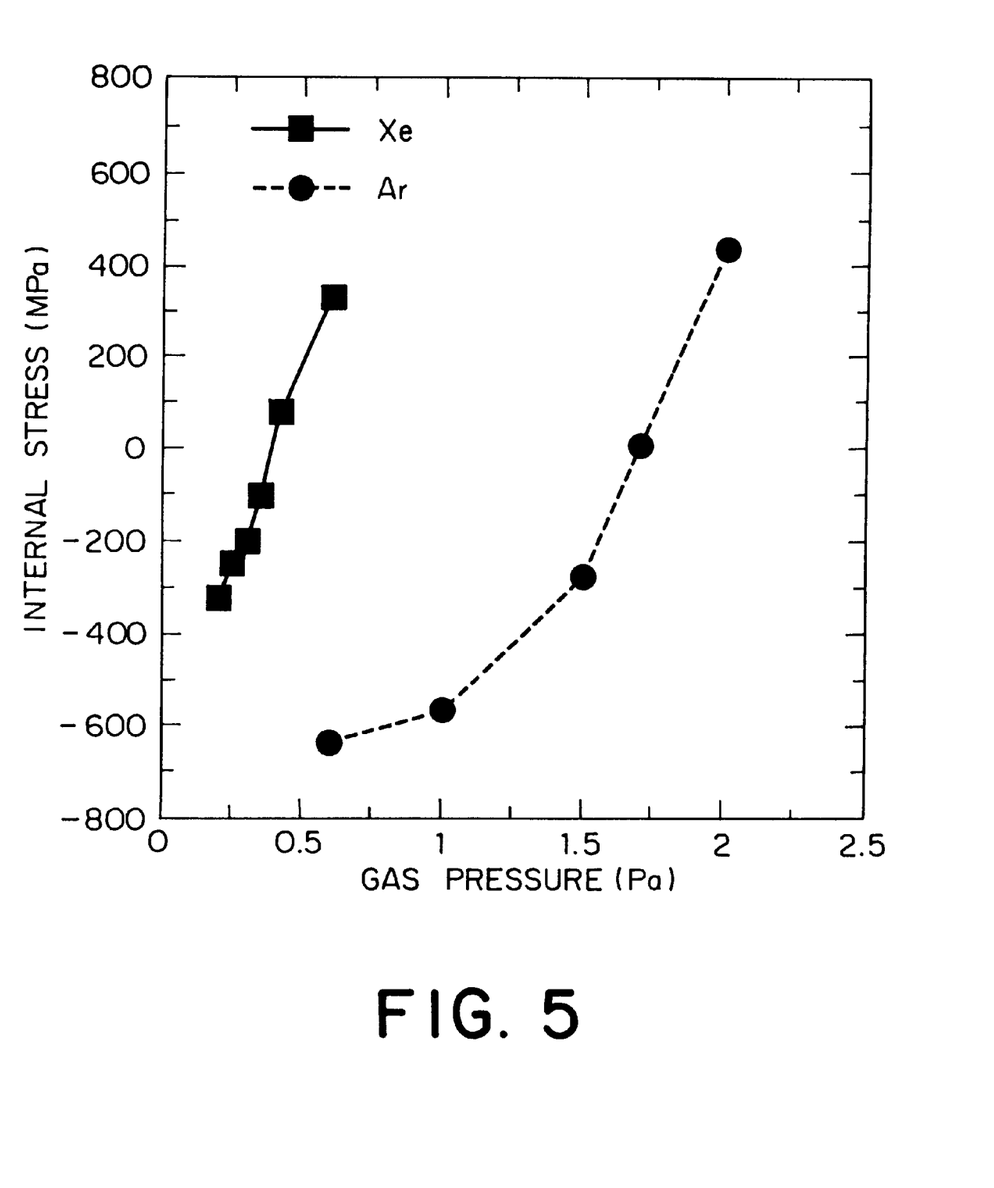
FIG. 5 is a graph illustrating a relationship between internal stresses of $Ta_4B$ films on Si and a gas pressure of Xe or Ar.

Referring to FIG. 5, the sputtering rate for Xe gas is 20% higher than that for Ar gas. Gradient of the film stress against the gas pressure can be regarded as a measure of stress controllability. The gradient for Xe is almost the same as that for Ar. The gas pressure at zero stress for Xe is lower than that for Ar. The lower sputtering gas pressure will bring about preciser stress controllability because pressure variations in higher pressure range, caused by the error of the pressure controller, give rise to larger stress variations than in lower pressure range. Xe gas can control the film stress more precisely than Ar gas under the deposition condition.

Figure 6A:
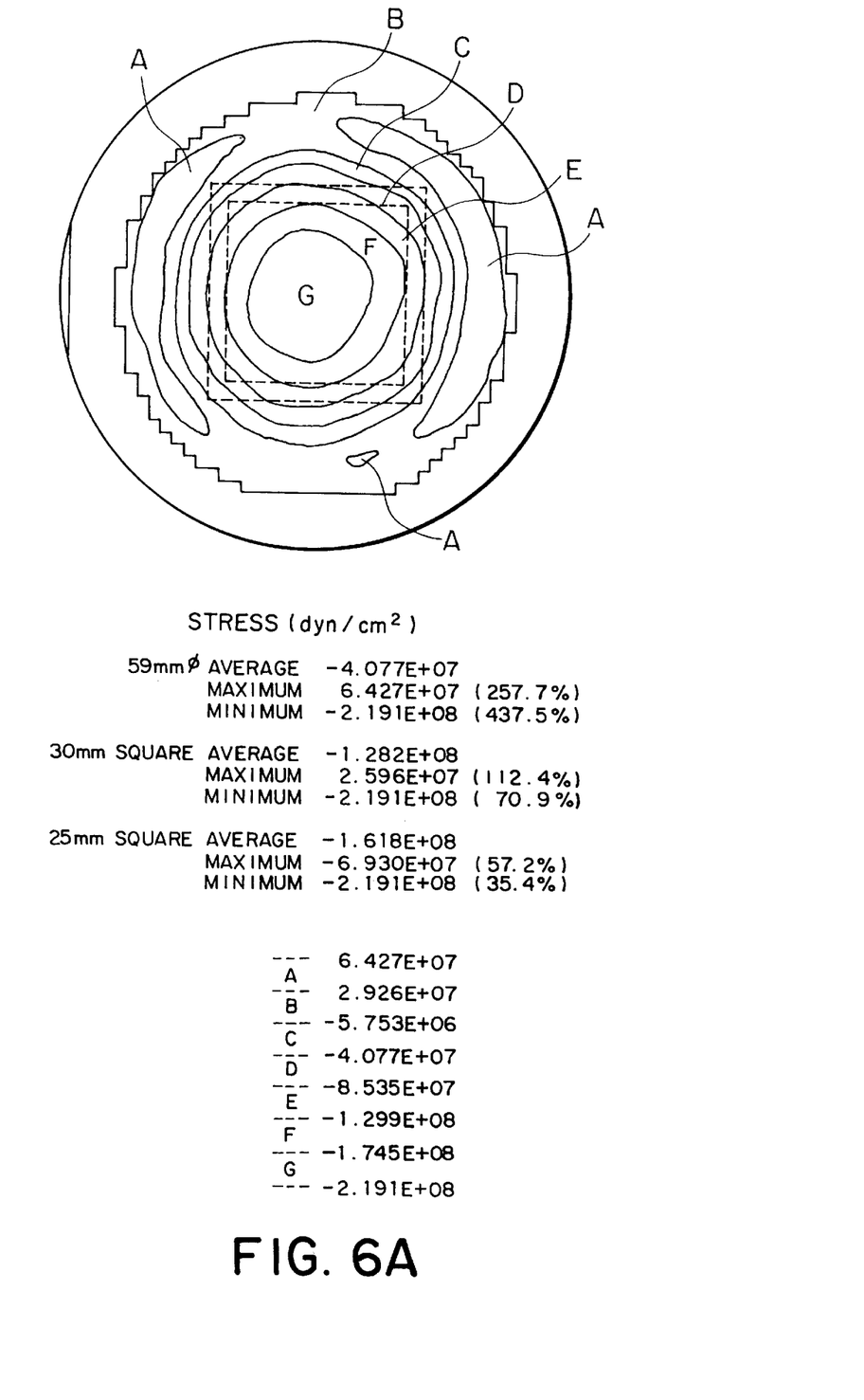
FIGS. 6A, 6B, 7A, and 7B are views for use in explaining stress distributions of $Ta_4B$ films deposited on Si wafers by Xe and Ar gas sputtering according to the present invention.
Figure 6B:
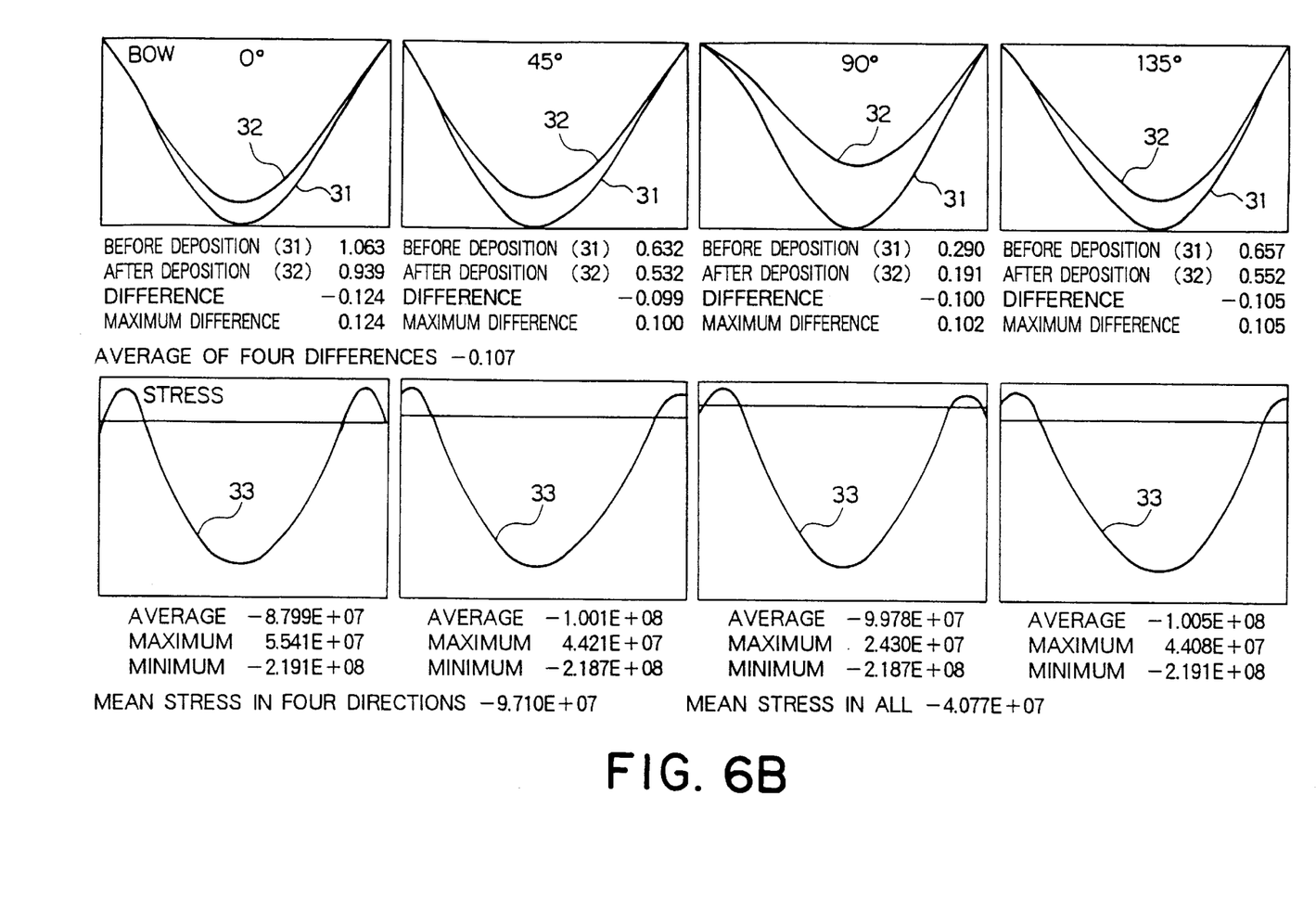
Figure 7A:
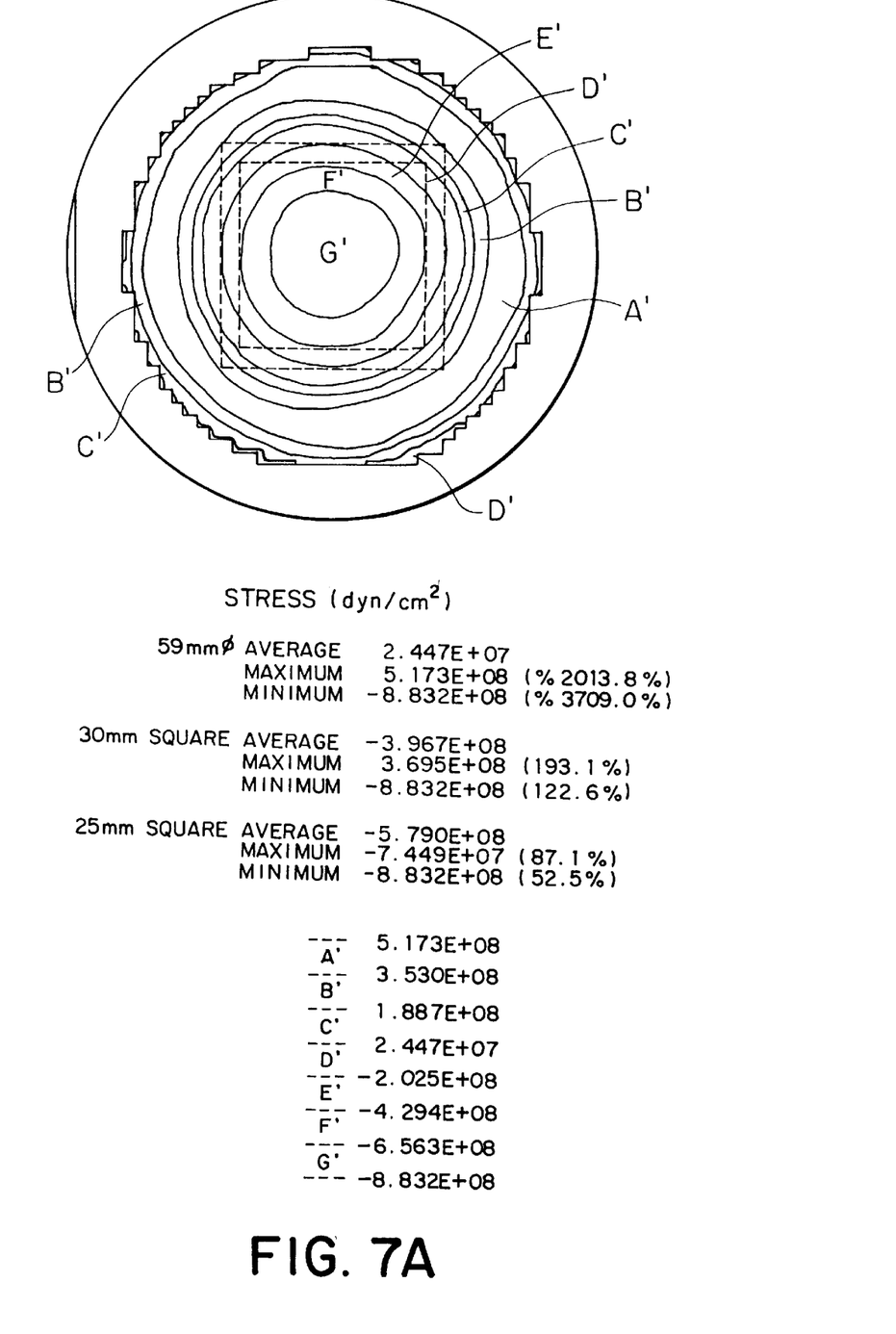
Figure 7B:
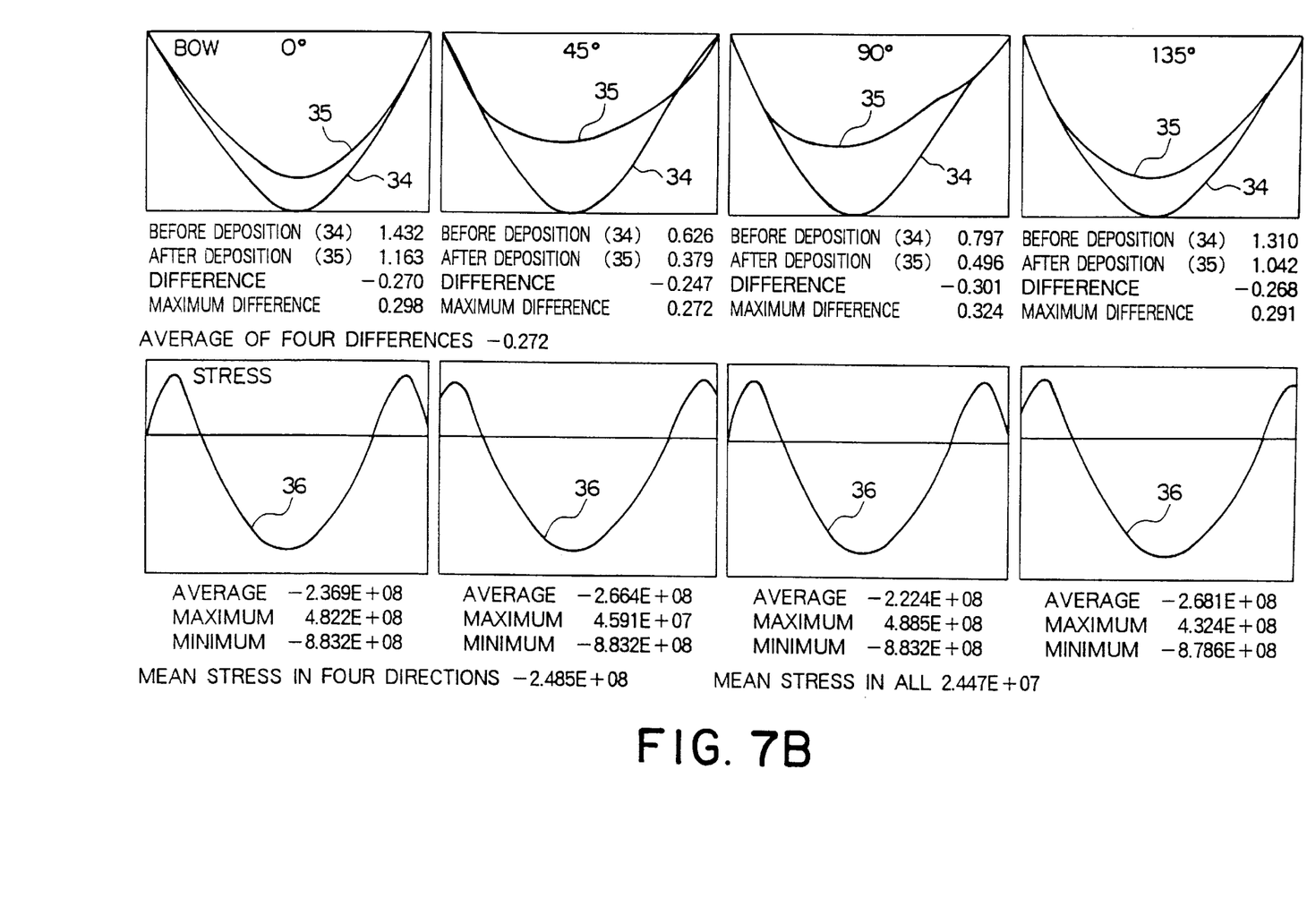

Referring to FIGS. 6A, 6B, 7A and 7B, stress distributions of $Ta_4B$ films deposited on Si wafers by Xe and Ar gas sputtering, measured by an "NTT-AT" stress measurement apparatus, are shown, respectively. In FIG. 6A, "A to G" drawn on the upper side of the sheet with respect to the disk represent areas of stress distribution, and correspond to the values given in the lower side of the same sheet. In a similar manner, in FIG. 7A, "A" to "G" drawn on the upper side of the sheet with respect to the disk represent areas of the stress distribution, and correspond to the values given in the lower side of the same sheet. The annealing after the deposition gives low stress to the both films. Stress distribution on 25 mm square area for the Ta$_4$B film sputtered by Ar and Xe gases are ±40 MPa and ±7 MPa, respectively. From these results, Xe gas sputtering can fabricate more uniform stress distribution than Ar gas sputtering.

Figure 8:
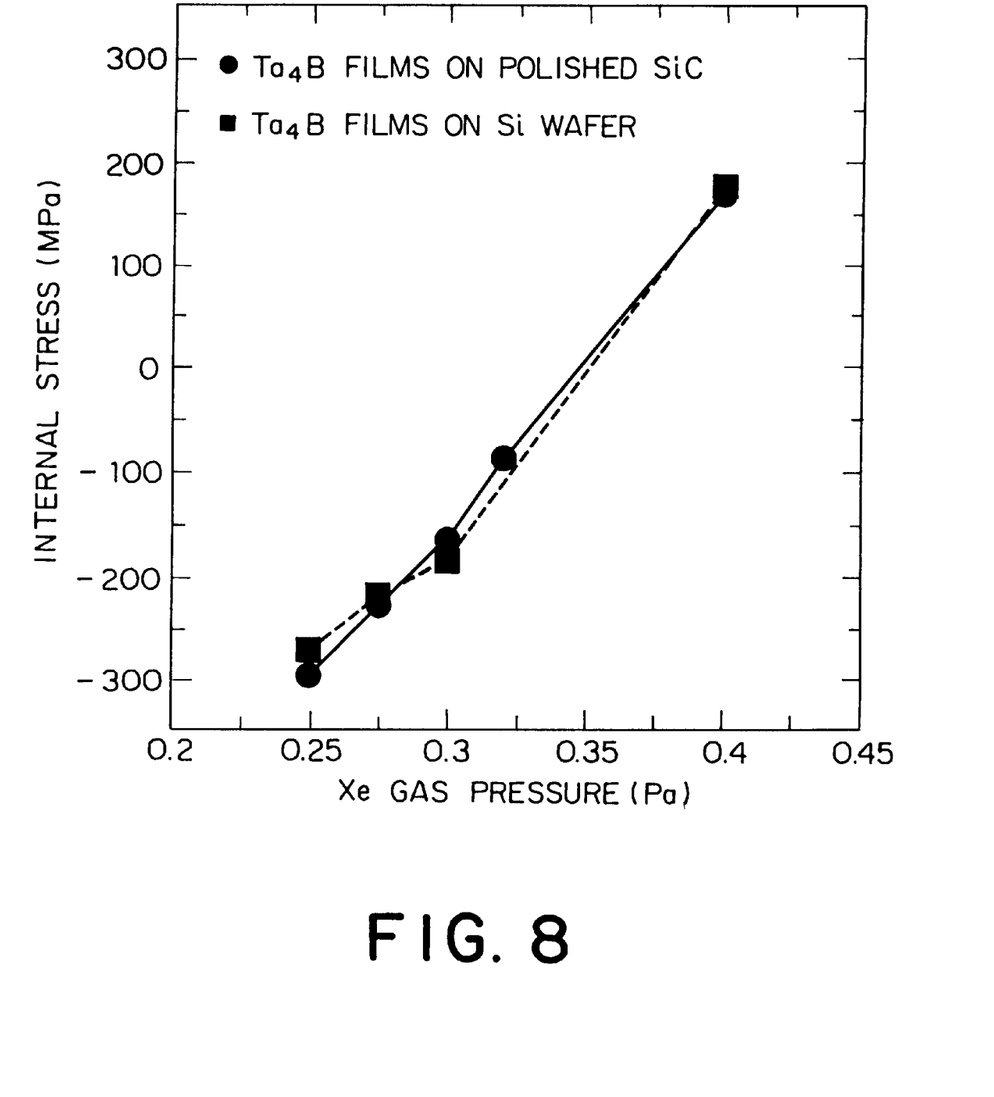
FIG. 8 is a graph illustrating a relationship between internal stresses of $Ta_4B$ films on polished SiC films and Si wafers by a Xe gas sputtering and a sputtering gas pressure.

Referring to FIG. 8, the stress of the both films show similar behaviors. The internal stresses of Ta$_4$B films are not influenced by the surface roughness of the substrate used.

Figure 9:
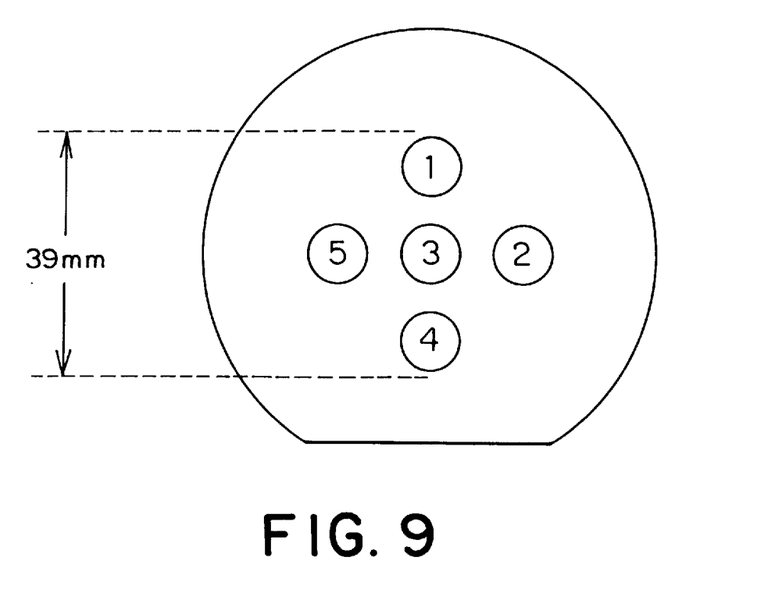
FIG. 9 is a view for use in explaining a measurement position of local stress within the circular membrane area of 39 mm diameter.

Referring to FIG. 9, a stress distribution of Ta$_4$B films on polished SiC films was also measured by a HOYA bulge height measurement system by the use of five relatively small circular windows of 10 mm diameter within 39 mm diameter area.

Figure 10:
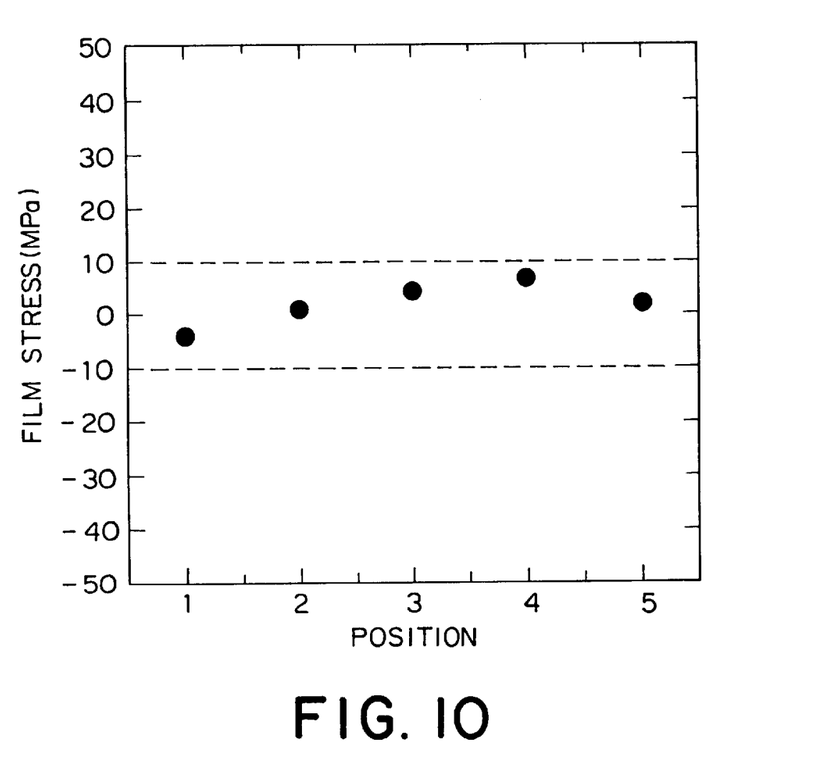
FIG. 10 is a graph illustrating a local distribution of 0.5 μm thick $Ta_4B$ film on SiC membrane according to the present invention.

Referring to FIG. 10, the stress uniformity in 39 mm diameter was ±5.4 MPa for Ta$_4$B film, which is almost coincided with the result on Si wafer measured by the NTT-AT measurement system. In FIG. 10, numerals of the abscissa correspond to positions of circle-numerals shown in FIG. 9. The Ta$_4$B film with low stress of less than 10 MPa can be easily obtained on the polished SiC film by Xe gas sputtering and the following annealing.

The use of Xe gas as a sputter gas improves stress controllability and stress distribution for the Ta$_4$B absorber film. The stress of the Ta$_4$B film on polished SiC film with a roughness of less than 1.0 nmRa shows the same behavior as the Si on wafer. The Xe gas sputtering and the subsequent annealing have brought low stress distribution of ±5.4 MPa in 39 mm diameter measured by a bulge method, to the Ta$_4$B film on the polished SiC film.

What is claimed is:

1. An X-ray mask blank comprising a substrate, an X-ray transparent film on said substrate, and an X-ray absorber film having a predetermined area in which a stress distribution pattern is formed based on a distribution of stress extending between a minimum and a maximum value and a surface roughness within a range not more than 2.0 nmRa, wherein Ra represents a center line average height, both said maximum and minimum values of stress being within a range between 0 and ±10 MPa and existing at a plurality of points within said pattern at which stresses are measured on the predetermined area.

2. An X-ray mask blank as claimed in claim 1, wherein said X-ray absorber film has a thickness between 0.1 and 1.0 μm.

3. An X-ray mask blank as claimed in claim 1, wherein said X-ray absorber film is made from a material of an amorphous structure.

4. An X-ray mask blank as claimed in claim 1, wherein said X-ray absorber film is made from a material containing Ta as a main element.

5. An X-ray mask blank as claimed in claim 1, wherein said X-ray absorber film is made from a material containing Ta and B.

6. An X-ray mask blank as claimed in claim 5, wherein said X-ray absorber film contains Ta and B at an atomic ratio (Ta/B) between 8.5/1.5 and 7.5/2.5.

7. An X-ray mask blank as claimed in claim 1, wherein said X-ray transparent film has a flat surface, said flat surface being formed by mirror-mechanical polishing.

8. An X-ray mask blank as claimed in claim 1, wherein said X-ray transparent film is made from silicon carbide.

9. An X-ray mask blank as claimed in claim 1, wherein the controlled stress distribution falls within ±7 MPa.

10. An X-ray mask blank as claimed in claim 1, wherein said minimum stress is exhibited at a center of said predetermined area and said maximum stress is exhibited at a circumference of said predetermined area.

11. An X-ray mask blank as claimed in claim 1, wherein said stress distribution pattern comprises substantially concentric circles.

12. An X-ray mask manufactured by patterning the X-ray mask blank claimed in claim 1.

13. A method of transcribing a pattern to a substrate using the X-ray mask claimed in claim 12.

14. An X-ray mask blank comprising a substrate, an X-ray transparent film on said substrate, and an X-ray absorber film, said X-ray absorber film having a predetermined area in which a stress distribution pattern is formed, said pattern being defined by the existence of a stress between 0 and ±10 MPa at a plurality of points at which stresses are measured on the predetermined area, wherein said X-ray absorber film has a thickness between 0.1 and 1.0 μm, and wherein said X-ray absorber film is specified by a product of said stress and said thickness both of which are measured at the same points, both maximum and minimum values of said product falling within a range between 0 and ±5×10$^3$ dyn/cm.

15. An X-ray mask blank as claimed in claim 14, wherein said X-ray absorber film has a surface roughness within a range not more than 2.0 nmRa, wherein Ra represents a center line average height.

16. An X-ray mask blank as claimed in claim 14, wherein said stress distribution pattern comprises substantially concentric circles.

17. A method of producing an X-ray mask blank comprising a step of forming an X-ray absorber film on an X-ray transparent film, said X-ray transparent film, said X-ray transparent film being formed on a substrate, said step comprising sub-steps of:

flattening a surface of said X-ray transparent film to have a smooth surface within a range not more than 2.0 nmRa; and forming said X-ray absorber film on said smooth surface, wherein said forming step comprises controlling a stress distribution of said X-ray absorber film on a predetermined area thereof so that a pattern of stress distribution is formed which exhibits for respective portions of the pattern a stress of 0 to ±10 MPa at a plurality of points at which stresses are measured on the predetermined area.

18. A method as claimed in claim 17, wherein said stress distribution is controlled by sputtering a target with x-ray absorber material in a Xe gas as a sputtering gas.

19. A method as claimed in claim 17, wherein said stress distribution is controlled by annealing after forming said x-ray absorber film to control stress.

20. A method of producing an X-ray mask blank as claimed in claim 17, wherein said stress distribution pattern comprises substantially concentric circles.

21. A method of producing an X-ray mask blank comprising a step of forming an X-ray absorber film on an X-ray transparent film, said X-ray transparent film being formed on a substrate, wherein said absorber film forming step comprises the sub-steps of forming said absorber film (1) to have a thickness between 0.1 and 1.0 μm and a predetermined area in which is formed a stress distribution pattern that is defined by values of stress between a maximum and a minimum value, and (2) to exhibit a stress of 0 to ±10 MPa at a plurality of points on the predetermined area and (3) to obtain a product of said thickness and said stress based on a control of said thickness, said stress and stress distribution in said step, wherein both of said thickness and said stress are measured at the same points on said predetermined area, both maximum and minimum values of said product falling within a range between 0 to $\pm 5 \times 10^3$ dyn/cm.

22. A method as claimed in claim 21, wherein said stress distribution is controlled by sputtering a target with X-ray absorber material in a Xe gas as a sputtering gas.

23. A method as claimed in claim 21, wherein said stress distribution is controlled by annealing after forming said x-ray absorber.

24. A method of producing an X-ray mask blank as claimed in claim 21, wherein said stress distribution pattern comprises substantially concentric circles.

* * * * *